(12) United States Patent
Knierim et al.

(10) Patent No.: US 11,249,111 B2
(45) Date of Patent: Feb. 15, 2022

(54) AUTOMATIC PROBE GROUND CONNECTION CHECKING TECHNIQUES

(71) Applicant: Tektronix, Inc., Beaverton, OR (US)

(72) Inventors: Daniel G. Knierim, Beaverton, OR (US); William A. Hagerup, Portland, OR (US); Barton T. Hickman, Portland, OR (US); Ira G. Pollock, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/028,236

(22) Filed: Jul. 5, 2018

(65) Prior Publication Data

US 2018/0313870 A1      Nov. 1, 2018

Related U.S. Application Data

(62) Division of application No. 14/949,562, filed on Nov. 23, 2015, now Pat. No. 10,041,975, which is a division of application No. 13/649,303, filed on Oct. 11, 2012, now Pat. No. 9,194,888.

(51) Int. Cl.
*G01R 1/067* (2006.01)
*G01R 31/02* (2006.01)
*G01R 31/50* (2020.01)
*G01R 31/54* (2020.01)

(52) U.S. Cl.
CPC ..... *G01R 1/06788* (2013.01); *G01R 1/06766* (2013.01); *G01R 1/06794* (2013.01); *G01R 31/50* (2020.01); *G01R 31/54* (2020.01)

(58) Field of Classification Search
None
See application file for complete search history.

(56) References Cited

U.S. PATENT DOCUMENTS

| | | | | |
|---|---|---|---|---|
| 4,913,153 A | * | 4/1990 | Hagmann | A61B 5/05 324/127 |
| 6,064,312 A | * | 5/2000 | Weller | G01R 1/06788 324/527 |
| 6,836,107 B2 | * | 12/2004 | Mende | G01R 15/185 324/117 H |
| 6,841,986 B1 | * | 1/2005 | Tannehill | G01R 1/06788 324/754.29 |
| 9,000,776 B1 | * | 4/2015 | Tam | G06F 30/367 324/638 |

(Continued)

OTHER PUBLICATIONS

European Patent Office, Extended European Search Report and Written Opinion for European Application No. 18209903.6, dated Apr. 1, 2019, 15 pages, Munich, Germany.

*Primary Examiner* — Jermele M Hollington
(74) *Attorney, Agent, or Firm* — Miller Nash LLP; Andrew J. Harrington

(57) ABSTRACT

A test system can include a probe suitable to be coupled between a test measurement device and a device under test (DUT). The probe can include a signal input to receive an active signal from the DUT and a signal output to provide the active signal to the test measurement device. The probe can also include an input ground to connect to the DUT ground and an output ground to connect to the test measurement device ground. A probe ground connection checking device can automatically determine whether the probe ground connections to the DUT ground and test measurement device ground are solid.

8 Claims, 7 Drawing Sheets

(56) References Cited

U.S. PATENT DOCUMENTS

| | | | |
|---|---|---|---|
| 9,194,888 B2 * | 11/2015 | Knierim | G01R 1/06766 |
| 9,304,150 B2 * | 4/2016 | Johnson | G01R 15/207 |
| 10,041,975 B2 * | 8/2018 | Knierim | G01R 1/06766 |
| 2003/0189422 A1 * | 10/2003 | McTigue | G01R 1/20 324/72.5 |
| 2006/0158798 A1 * | 7/2006 | Jackson | H02H 3/334 361/42 |
| 2007/0143050 A1 * | 6/2007 | Booth, Jr. | G01R 35/00 702/104 |
| 2007/0257657 A1 * | 11/2007 | Stevens | G01R 15/202 324/72.5 |
| 2009/0206859 A1 * | 8/2009 | Swaim | G01R 1/06788 324/756.03 |
| 2010/0118449 A1 * | 5/2010 | Jackson | G01R 15/185 361/42 |
| 2018/0306840 A1 * | 10/2018 | Peschke | G01R 1/06766 |
| 2020/0295728 A1 * | 9/2020 | Toya | G01R 19/0092 |
| 2021/0088553 A1 * | 3/2021 | Knierim | G01R 31/50 |

* cited by examiner

AUTOMATIC PROBE GROUND CONNECTION CHECKING TECHNIQUES

CROSS-REFERENCE TO RELATED APPLICATIONS

This application is a divisional of U.S. patent application Ser. No. 14/949,562, titled AUTOMATIC PROBE GROUND CONNECTION CHECKING TECHNIQUES and filed on Nov. 23, 2015, now U.S. Pat. No. 10,041,975, which is a divisional of U.S. patent application Ser. No. 13/649,303, titled AUTOMATIC PROBE GROUND CONNECTION CHECKING TECHNIQUES and filed on Oct. 11, 2012 now U.S. Pat. No. 9,194,888, the contents of which are hereby fully incorporated by reference in their entirety.

BACKGROUND

The connection between an oscilloscope probe and a device under test (DUT) is often unreliable due to motion of the probe, e.g., if held by hand, motion of the DUT, e.g., vibration or thermal expansion, or both. The presence of a faulty connection for the "active" lead, e.g., signal lead of a probe to the DUT, is usually easy to determine if the registered signal is dramatically different from the expected signal.

However, the presence of a faulty connection for the "cold" lead, e.g., ground lead of a probe or negative lead of a differential probe connected to the DUT ground, is much more difficult to determine. This is because there is usually a low-frequency ground connection between the oscilloscope and the DUT through grounding power cords, other probe channel grounds, etc., and sometimes a high-frequency connection through capacitive coupling across the faulty connection. Thus, only a band of frequencies is typically misrepresented in the acquired oscilloscope record, which often causes subtle errors that are easy to miss by a user.

Oscilloscope users have traditionally dealt with this unreliability by either wiggling the probe to see if anything changes in the signal or temporarily disconnecting the probe from the oscilloscope and measuring the resistance from the probe ground to the DUT ground with an ohmmeter.

While the "probe wiggling" approach is generally quick and intuitive, this approach is rather heuristic in nature and often causes a good connection to become bad. While the "temporary disconnecting" approach indeed checks the probe ground to DUT ground connection, this approach requires manual intervention and also adds wear to the probe connector.

SUMMARY

Embodiments of the disclosed technology generally include an automated probe-to-DUT (device under test) connection verification that can be easily initiated through an oscilloscope user interface, e.g., by way of a button on the probe or oscilloscope front-panel, a menu entry, a remote command over a general purpose interface bus (GPIB) or local area network (LAN), automatically, or any combination thereof.

DETAILED DESCRIPTION

Embodiments of the disclosed technology generally include various techniques for automatically checking a ground connection between an oscilloscope and a device under test (DUT), e.g., within a probe and/or probe cable. These and other features and embodiments of the present invention proceed with reference to each of the figures.

Figure 1:
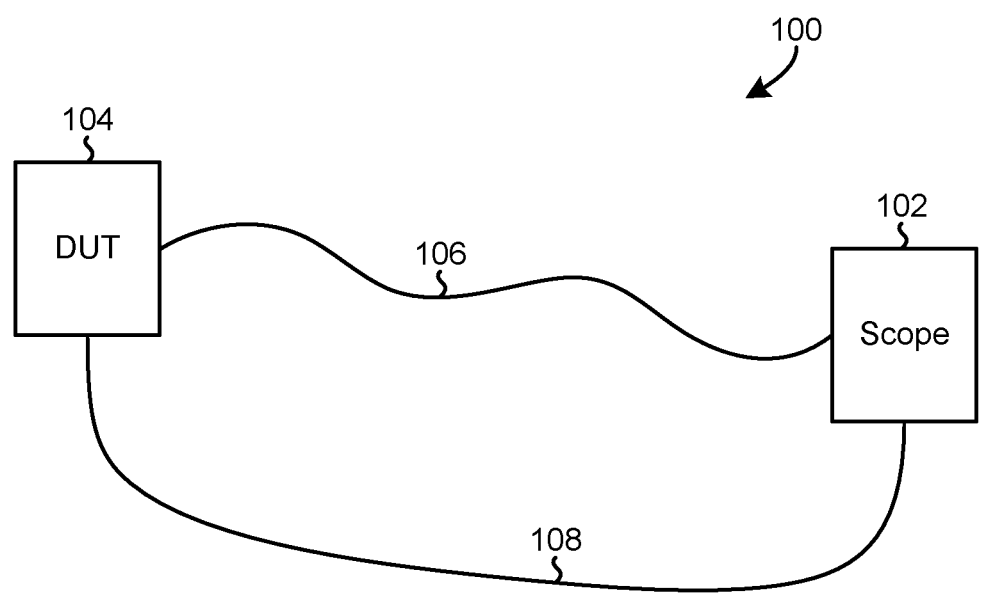
FIG. 1 illustrates an example of a testing system in accordance with certain embodiments of the disclosed technology.

FIG. 1 illustrates an example of a testing system 100 in accordance with certain embodiments of the disclosed technology. The testing system 100 includes an oscilloscope 102, a DUT 104, and a ground connection 106 between the oscilloscope 102 and the DUT 104. The ground connection 106 is usually established by way of a probe and corresponding probe cable and/or other suitable connecting mechanism.

The testing system 100 also includes an auxiliary ground 108 that exists due to indirect physical connections between the oscilloscope 102 and the DUT 104, such as power-cord ground connections, ground connections of other probes, a table or other supporting structure, floor, etc. In certain systems, however, the auxiliary ground 108 is not present.

Figure 2:
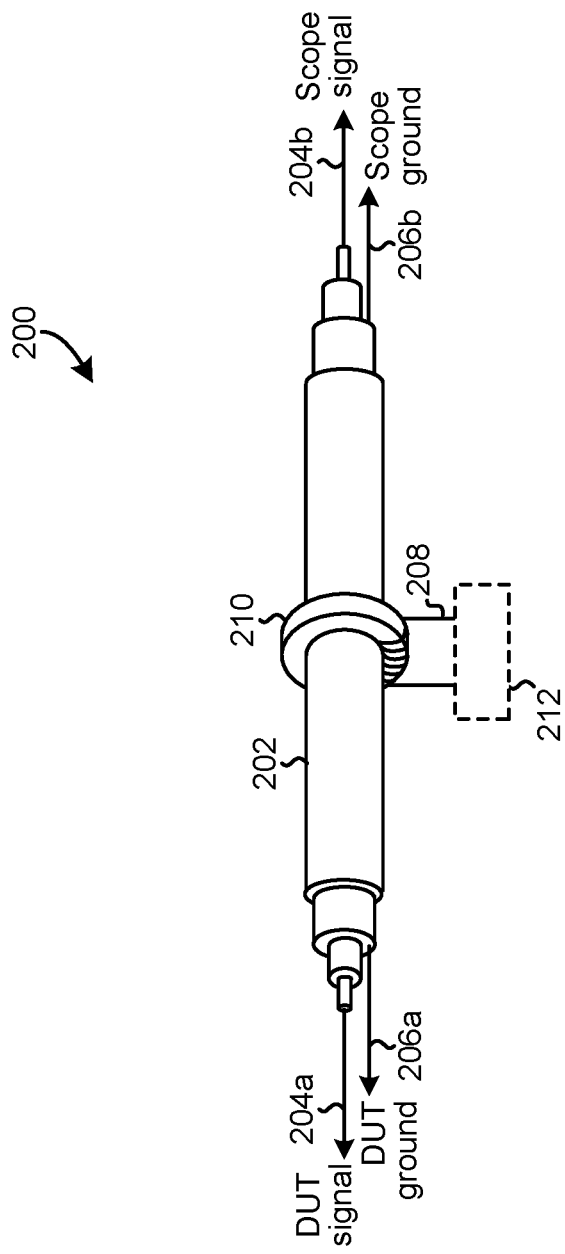
FIG. 2 illustrates an example of a first technique for checking a ground connection between an oscilloscope and a DUT, such as the oscilloscope and DUT of FIG. 1, in accordance with certain embodiments of the disclosed technology.

FIG. 2 illustrates an example of a first technique 200 for checking a ground connection between an oscilloscope and a DUT, such as the oscilloscope 102 and the DUT 104 of FIG. 1, in accordance with certain embodiments of the disclosed technology. The example includes a probe or probe cable 202, such as a coaxial cable, that has a signal input 204a, e.g., to receive an active signal from the DUT, a signal output 204b, e.g., to provide the signal to the oscilloscope, an input ground 206a, e.g., to connect to the DUT ground, and an output ground 206b, e.g., to connect to the oscilloscope ground.

In the example, the first technique 200 includes the inductive coupling of a test coil 208 to the probe cable 202 by passing both through a magnetic core 210 and measuring the inductance of the test coil 208, e.g., by way of an optional impedance meter 212. This may be performed, for example, by injecting an alternating current therein and measuring the resulting voltage.

A solid probe-to-DUT ground connection, combined with another oscilloscope-to-DUT ground connection, e.g., power cords, may create a shorted loop through the magnetic core, thereby lowering the inductance of the test coil.

One having ordinary skill in the art will appreciate that the illustrated technique 200 is shown functionally and that the physical implementation thereof may be accomplished using any of a number of ways. For example, either or both of the test coil 208 and magnetic core 210 may be partially or fully integrated with the probe cable 202 or, alternatively, removably attachable thereto. Similarly, the optional impedance meter 212 or other suitable measurement device may be integrated with or separate from either or both of the test coil 208 and magnetic core 210.

The illustrated technique 200 provides a number of advantages. For example, the magnetic core 210, test coil 208, or combination thereof are generally easy to add to existing probe designs. Alternatively, the magnetic core 210, test coil 208, or combination thereof may be constructed as a separate accessory that may be used in connection with virtually any existing probe cable.

The illustrated technique 200 is also advantageous in that such implementations generally do not interfere with the signal-path design of a probe. Further, verification of the ground connection may be performed without affecting active signal acquisitions, at least in situations where the connection is solid.

Figure 3:
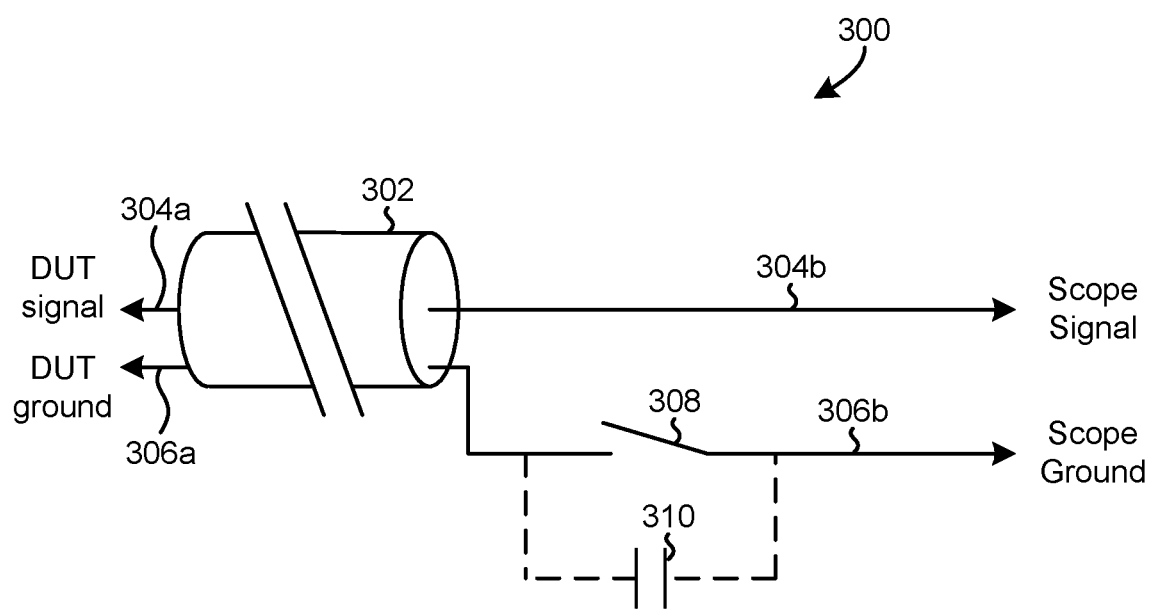
FIG. 3 illustrates an example of a second technique for checking a ground connection between an oscilloscope and a DUT, such as the oscilloscope and DUT of FIG. 1, in accordance with certain embodiments of the disclosed technology.

FIG. 3 illustrates an example of a second technique 300 for checking a ground connection between an oscilloscope and a DUT, such as the oscilloscope 102 and the DUT 104 of FIG. 1, in accordance with certain embodiments of the disclosed technology. The example includes a probe or probe cable 302 that has a signal input 304a, e.g., to receive an active signal from the DUT, a signal output 304b, e.g., to provide the signal to the oscilloscope, an input ground 306a, e.g., to connect to the DUT ground, and an output ground 306b, e.g., to connect to the oscilloscope ground.

In the example, the technique 300 includes separating the input ground 306a from the output ground 306b, e.g., by way of a switch mechanism 308, inserting a direct current into the input ground 306a, and checking for a low DC resistance return path, e.g., through the probe-to-DUT ground connection and oscilloscope-to-DUT ground connection. The determination of a low DC resistance return path may indicate that the ground path within the probe cable 302 is functioning as expected, whereas a high DC resistance return path may indicate the presence of a disconnect or other issue with the probe ground path.

In certain embodiments, the input ground 306a and output ground 306b may be AC coupled, e.g., by way of an optional capacitor 310, to allow for AC signal current flow during the check for a low DC resistance return path. Capacitor 310 may also be useful in reducing the high-frequency impedance of the probe ground path due to inductance and/or resistance in the switch mechanism 308.

Figure 4:
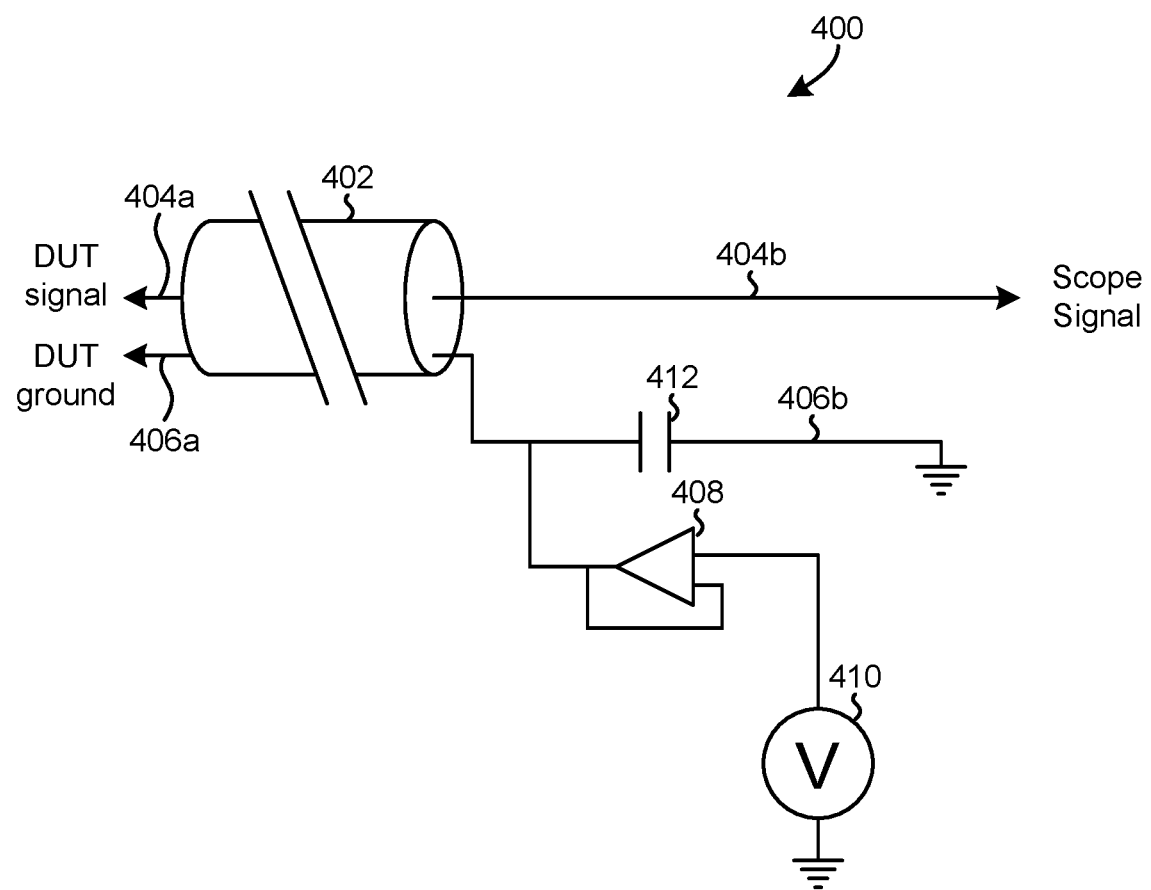
FIG. 4 illustrates an example of a third technique for checking a ground connection between an oscilloscope and a DUT, such as the oscilloscope and DUT of FIG. 1, in accordance with certain embodiments of the disclosed technology.

FIG. 4 illustrates an example of a third technique 400 for checking a ground connection between an oscilloscope and a DUT, such as the oscilloscope 102 and the DUT 104 of FIG. 1, in accordance with certain embodiments of the disclosed technology. This example is similar to the example illustrated in FIG. 3 in that it includes a probe or probe cable 402 that has a signal input 404a, e.g., to receive an active signal from the DUT, a signal output 404b, e.g., to provide the signal to the oscilloscope, an input ground 406a, e.g., to connect to the DUT ground, and an output ground 406b, e.g., to connect to the oscilloscope ground.

The example illustrated in FIG. 4 is different from the example illustrated in FIG. 3, however, in that the technique 400 includes a buffer amplifier 408 and voltage source 410, e.g., a DAC, between the input ground 406a and the output ground 406b rather than a switch mechanism separating the input ground 406a from the output ground 406b. Here, the voltage source 410 can be programmed to drive the input ground [through the buffer amplifier 408] to 0.0 V, e.g. ground, for normal operation or to some non-zero voltage to check for a low-impedance path back to the scope ground through the auxiliary path. That is, this technique can check for an output current-limit condition in the buffer amplifier 408 to determine a low-resistance path.

The example illustrated in FIG. 4 also includes a capacitor 412 in parallel with the buffer amplifier 408 and voltage source 410. By monitoring the behavior, e.g., current draw, of the buffer amplifier 408 and voltage source 410, a determination may be made as to whether there is a disconnect or other issue with regard to the ground path within the probe cable 402 or the connection to the DUT ground at 406a.

The techniques 300 and 400 of FIGS. 3 and 4, respectively, provide various advantages. For example, the physical implementations have the potential of being very small. Also, the implementations of these techniques generally do not interfere with typical probe signal-path designs. Further, probe ground path integrity verification can be typically performed without affecting active signal acquisitions, at least in situations where the connection is solid.

Figure 5:
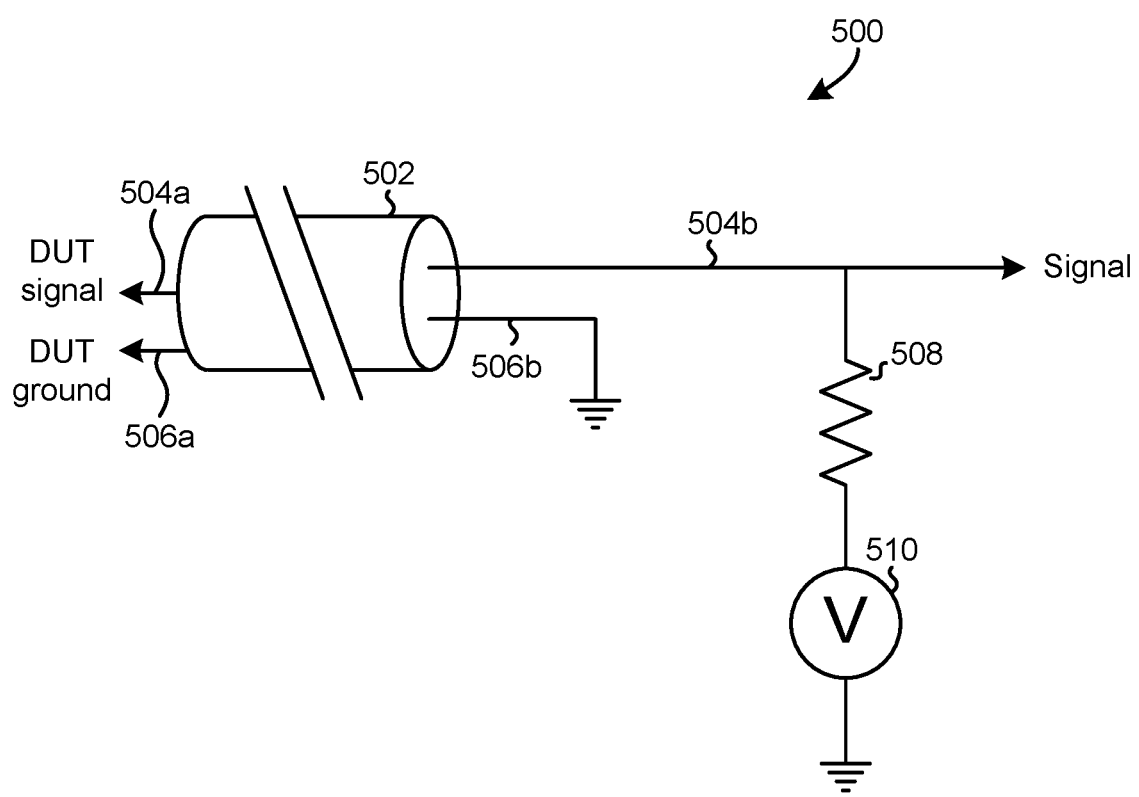
FIG. 5 illustrates an example of a fourth technique for checking a ground connection between an oscilloscope and a DUT in accordance with certain embodiments of the disclosed technology.

FIG. 5 illustrates an example of a fourth technique 500 for checking a connection between an oscilloscope probe and a DUT in accordance with certain embodiments of the disclosed technology. The example includes a probe or probe cable 502 that has a signal input 504a, e.g., to receive an active signal from the DUT, a signal output 504b, e.g., to provide the signal to the oscilloscope, an input ground 506a, e.g., to connect to the DUT ground, and an output ground 506b, e.g., to connect to the oscilloscope ground. In this example, however, there is no auxiliary ground connection so the technique involves checking the DUT signal and ground connections as well as the DUT drive impedance.

The example further includes a resistor 508 and a voltage source 510 such that the probe termination voltage may be adjusted. Once the voltage has been adjusted, a check may be made as to whether the calculated probe tip voltage stays relatively constant. A low-resistance drive generally indicates good connections, whereas a high-resistance drive generally indicates a bad connection, in which case the probe tip voltage may track the termination voltage.

In situations involving a differential or tri-mode probe, each pertinent termination voltage may be adjusted. If the termination voltages of the differential or tri-mode probe can be adjusted independently and/or the probe tip voltages measured independently, the two probe tip connections may be independently verified. Otherwise, a solid connection for both probe tips may still be simultaneously verified. Also, the differential probe tip signal connections can be verified with this technique independent of the absence or presence of an auxiliary ground connection.

Implementations of this technique 500 are particularly advantageous in that they can be fully implemented as software for many existing probe designs that provide adjustable termination voltages, so there is no need for additional probe hardware to perform the ground checking.

Figure 6:
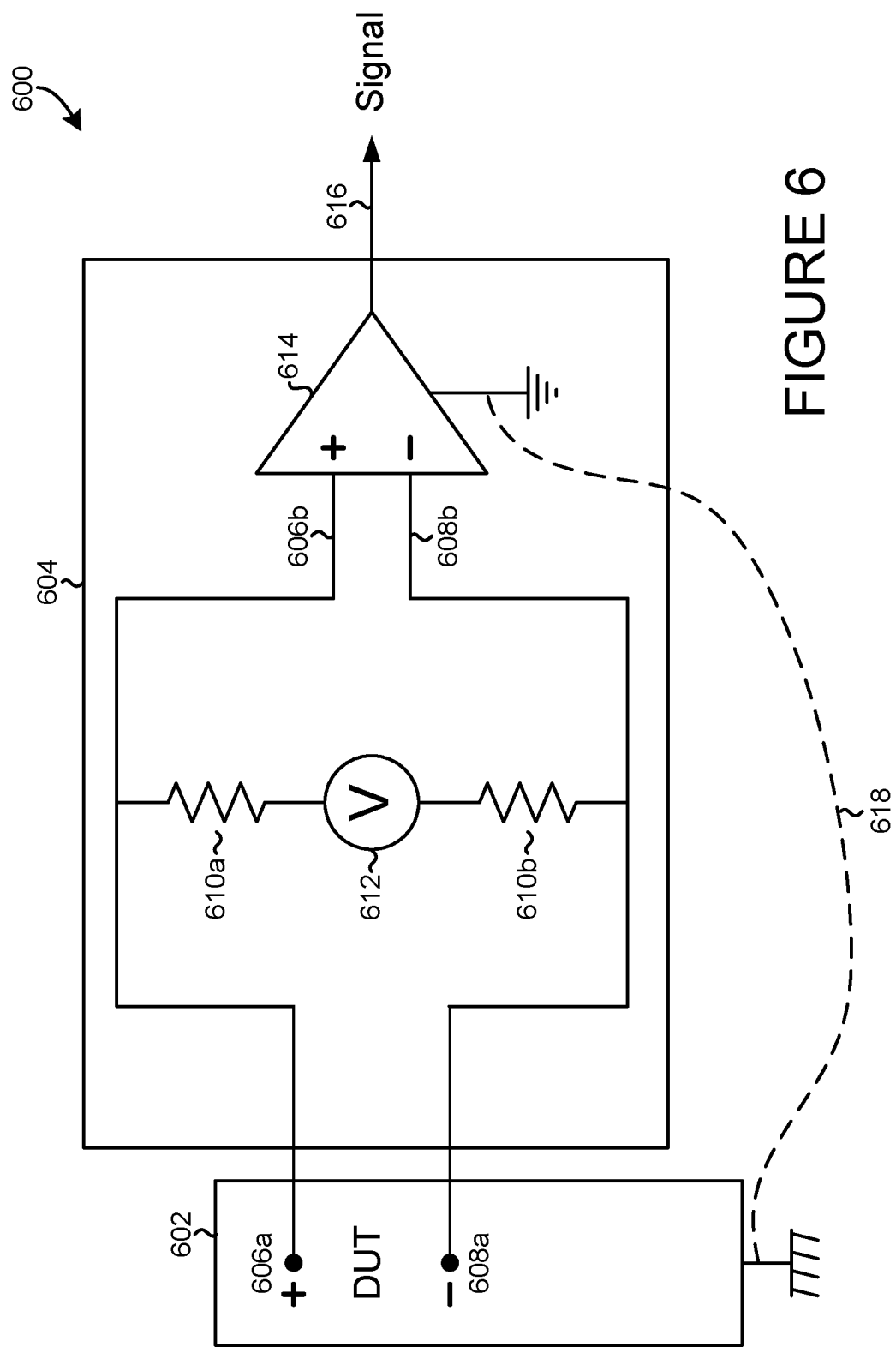
FIG. 6 illustrates an example of a fifth technique for checking a ground connection between an oscilloscope and a DUT in accordance with certain embodiments of the disclosed technology.

FIG. 6 illustrates an example of a fifth technique 600 for checking a connection between an oscilloscope probe and a DUT in accordance with certain embodiments of the disclosed technology. The example includes a probe or probe cable 604 configured to receive an input differential signal via DUT inputs 606a and 608a from DUT 602 and provide an output differential signal 616, e.g., to an oscilloscope.

In the example, the output differential signal 616 is generated by way of the input differential signal received from DUT inputs 606a and 608a being passed to internal circuitry 614 via internal inputs 606b and 608b. The probe 604 also includes resistors 610a and 610b and a voltage source 612 for adjusting the signal being passed to the internal circuitry 614 via the internal inputs 606b and 608b. This technique 600 is particularly advantageous in that it may be used to check for an intact differential connection, including differential ground path, regardless of whether an auxiliary ground connection 618 is present.

Figure 7:
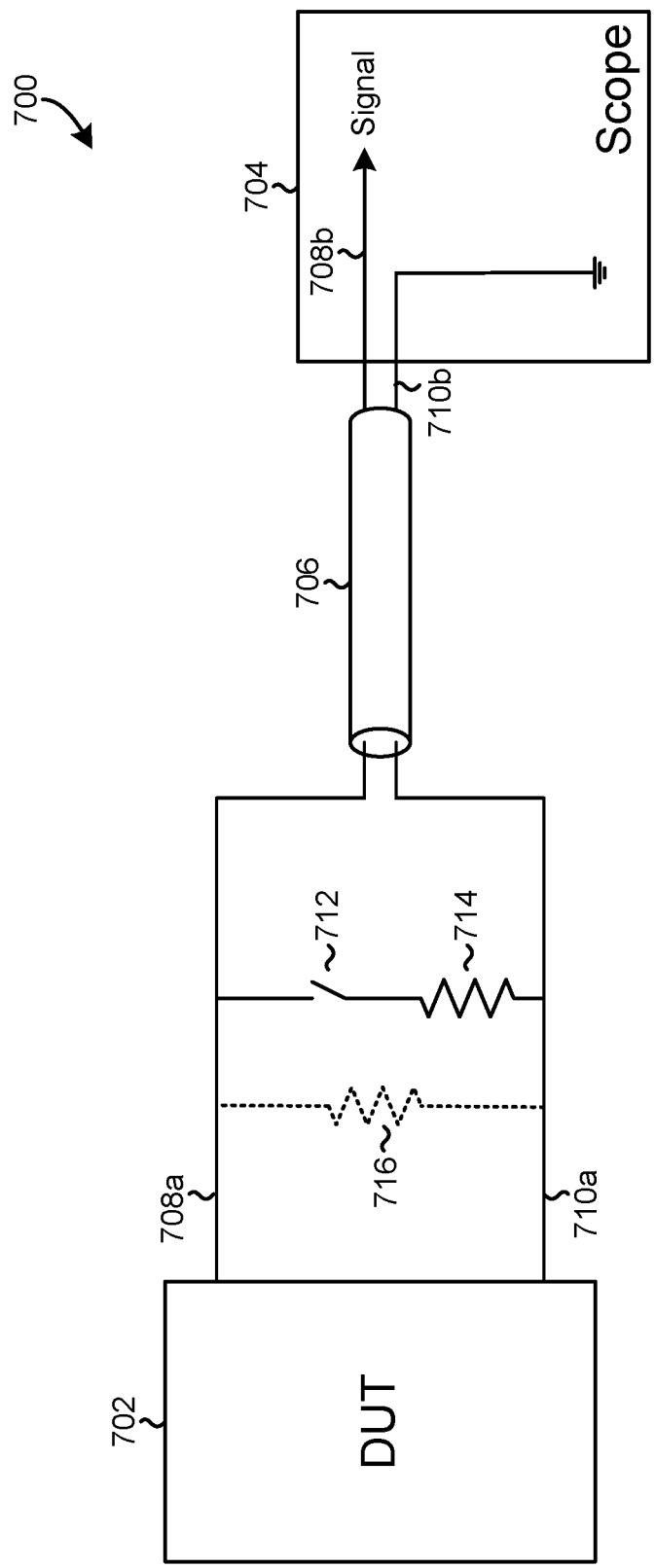
FIG. 7 illustrates an example of a sixth technique for checking a ground connection between an oscilloscope and a DUT, such as the oscilloscope and DUT of FIG. 1, in accordance with certain embodiments of the disclosed technology.

FIG. 7 illustrates an example of a sixth technique 700 for checking a ground connection between a DUT 702 and an oscilloscope 704 in accordance with certain embodiments of the disclosed technology. The example is similar to the example illustrated in FIG. 5 in that it includes a probe or probe cable 706, e.g., a de-embed probe, that has a signal input 708a, e.g., to receive an active signal from the DUT 702, a signal output 708b, e.g., to provide the signal to the oscilloscope 704, an input ground 710a, e.g., to connect to the ground of the DUT 702, and an output ground 710b, e.g., to connect to the ground of the oscilloscope 704.

In the example, a sub-assembly including a switching mechanism 712 and two impedance elements 714 and 716, where impedance element 716 represents the normal input impedance of the probe or probe cable 706, may be used to measure the source impedance driving the probe 706. The measured source impedance may then be compared with the expected source impedance, e.g., as determined by knowledge of the DUT 702. A substantially similar or identical match of the source impedance with the expected impedance generally indicates a good connection, whereas a mismatch generally indicates a disconnect or other issue with regard to the signal or ground connection between the DUT 702 and the probe or probe cable 706.

Implementations of this technique 700 are particularly advantageous in that, because they can be fully implemented as software, there is no need for additional probe hardware to perform the ground checking. Further, this technique 700 may be used to check both signal and ground lead connections, because a bad ground connection will generally be reflected in high source impedance for at least certain frequency bands.

In certain embodiments, a communication may be issued based on the checking of the probe ground connection using any of the techniques described herein. For example, an alert may be issued responsive to a determination that a disconnect or other issue is or may be present within the probe ground connection. In certain embodiments where no such disconnect or other issue is detected within the probe ground connection, a notification may be issued to advise the user that the probe ground connection appears to be solid.

An alert or notification such as those described above may include a visual indication, e.g., the lighting of an LED or issuing of a text-based or other type of message, an audible indication, e.g., a buzzing sound or other noise suitable to be heard by a user, or any suitable combination thereof. Alternatively or in addition thereto, the alert or notification may be delivered to the user by way of the test measurement device itself, e.g., by way of an oscilloscope display.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. An apparatus for checking a ground connection between a test and measurement instrument and a device under test, the device under test coupled to the test and measurement instrument by a probe, the probe including a probe cable having a probe cable ground path, the apparatus comprising:
 a magnetic core configured to receive the probe cable therethrough;
 a test coil configured to be coupled with said magnetic core; and
 a measuring circuit coupled to the test coil and structured to measure an impedance of the test coil.

2. The apparatus of claim 1, wherein said magnetic core is permanently coupled to said probe cable.

3. The apparatus of claim 2, wherein said test coil is permanently coupled to said magnetic core.

4. The apparatus of claim 1, wherein said magnetic core is removably attachable to said probe cable.

5. The apparatus of claim 1, wherein the test and measurement instrument is an oscilloscope, and wherein the oscilloscope is coupled to the measuring circuit and configured to determine, based on the measured impedance, whether a ground loop exists between the oscilloscope and the device under test.

6. The apparatus of claim 5, wherein the ground loop includes the probe cable ground path, a first ground connection between the probe cable ground path and the device under test ground, a second ground connection between the probe cable ground path and the oscilloscope ground, and a third ground connection between the device under test ground and the oscilloscope ground.

7. The apparatus of claim 5, further comprising a user interface coupled to the oscilloscope and configured to provide a user with an alert responsive to a determination that said ground loop does not exist.

8. The apparatus of claim 7, wherein the user interface comprises a display of the oscilloscope.

* * * * *